United States Patent
Chuang et al.

(10) Patent No.: US 8,889,501 B2
(45) Date of Patent: Nov. 18, 2014

(54) METHODS FOR FORMING MOS DEVICES WITH RAISED SOURCE/DRAIN REGIONS

(75) Inventors: Harry-Hak-Lay Chuang, Singapore (SG); Sin-Hua Wu, Zhubei (TW); Chung-Hau Fei, Hsin-Chu (TW); Ming Zhu, Singapore (SG); Bao-Ru Young, Zhubei (TW); Yen-Ru Lee, Hsin-Chu (TW); Chii-Horng Li, Zhubei (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 239 days.

(21) Appl. No.: 13/486,240

(22) Filed: Jun. 1, 2012

(65) Prior Publication Data
US 2013/0323893 A1    Dec. 5, 2013

(51) Int. Cl.
*H01L 21/336* (2006.01)
*H01L 21/8238* (2006.01)
*H01L 27/11* (2006.01)

(52) U.S. Cl.
CPC .................................. *H01L 27/1116* (2013.01)
USPC ..................... 438/197; 438/199; 257/E21.634

(58) Field of Classification Search
CPC ...................................................... H01L 27/1116
USPC .......................... 438/197, 199; 257/E21.634
See application file for complete search history.

(56) References Cited

U.S. PATENT DOCUMENTS

| | | | |
|---|---|---|---|
| 7,335,545 B2 * | 2/2008 | Currie | 438/197 |
| 2004/0262683 A1 * | 12/2004 | Bohr et al. | 257/338 |
| 2008/0102573 A1 * | 5/2008 | Liang et al. | 438/231 |
| 2008/0277735 A1 * | 11/2008 | Ko et al. | 257/369 |
| 2011/0101421 A1 * | 5/2011 | Xu | 257/255 |

\* cited by examiner

*Primary Examiner* — Luan C Thai
(74) *Attorney, Agent, or Firm* — Slater and Matsil, L.L.P.

(57) ABSTRACT

A method includes forming a first gate stack of a first device over a semiconductor substrate, and forming a second gate stack of a second MOS device over the semiconductor substrate. A first epitaxy is performed to form a source/drain stressor for the second MOS device, wherein the source/drain stressor is adjacent to the second gate stack. A second epitaxy is performed to form a first silicon layer and a second silicon layer simultaneously, wherein the first silicon layer is over a first portion of the semiconductor substrate, and is adjacent the first gate stack. The second silicon layer overlaps the source/drain stressor.

20 Claims, 10 Drawing Sheets

METHODS FOR FORMING MOS DEVICES WITH RAISED SOURCE/DRAIN REGIONS

BACKGROUND

Raised source/drains were adopted in the manufacturing of integrated circuits. The formation of the raised source/drains often involves epitaxially growing a silicon layer on the top surfaces of source/drain regions of NMOS devices. The epitaxy may be used to compensate for the loss in the portions of source/drain regions, which loss may be caused by a plurality of cleaning processes in the manufacturing of the MOS devices.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A p-type Metal-Oxide-Semiconductor (PMOS) device, an n-type Metal-Oxide-Semiconductor (NMOS) device, and the method of forming the same are provided in accordance with various exemplary embodiments. The intermediate stages of forming the PMOS device and the NMOS device are illustrated. The variations of the embodiments are discussed. Throughout the various views and illustrative embodiments, like reference numbers are used to designate like elements.

Figure 1:
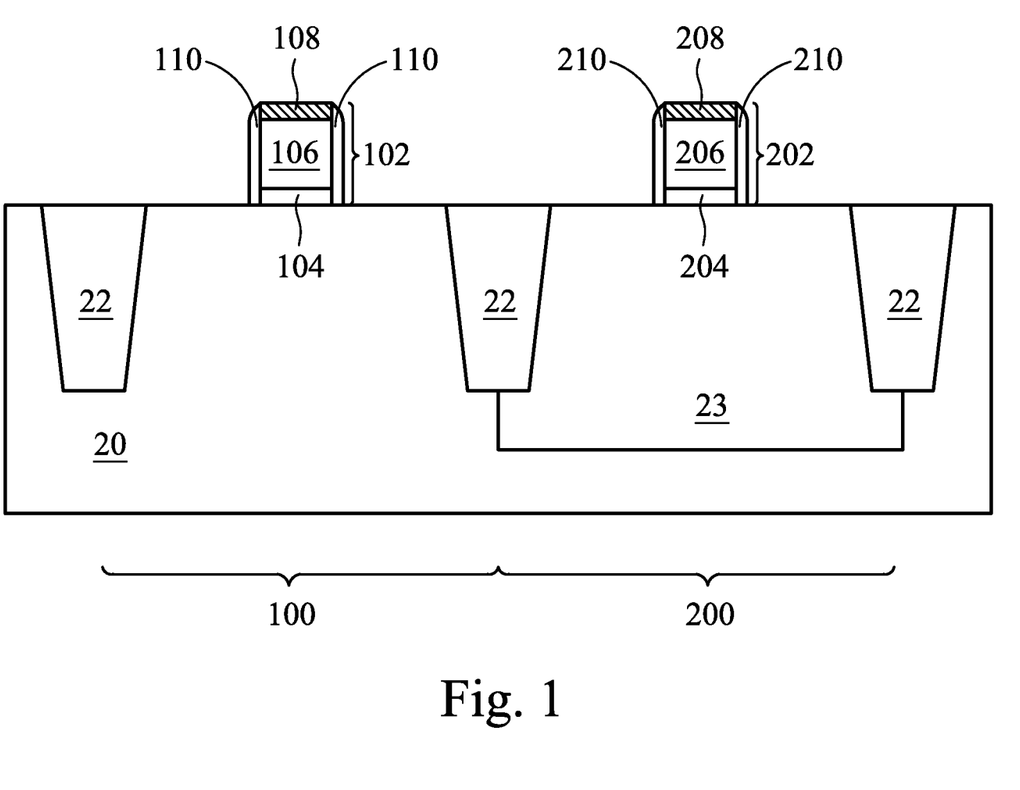
FIGS. 1 through 10 are cross-sectional views of intermediate stages in the manufacturing of a p-type Metal-Oxide-Semiconductor (PMOS) device and an n-type Metal-Oxide-Semiconductor (NMOS) device in accordance with some exemplary embodiments.

Referring to FIG. 1, substrate 20, which is a portion of a wafer, is provided. Substrate 20 may be formed of a semiconductor material such as silicon, germanium, Silicon germanium (SiGe), III-V compound semiconductor materials, or the like. Substrate 20 may be a bulk substrate or a semiconductor-On-Insulation (SOI) substrate. The SOI substrate may be a silicon-on-insulator substrate, a silicon germanium on insulator substrate, a germanium-on-insulator substrate, or the like. Substrate 20 comprises a first portion in NMOS device region 100 and a second portion in PMOS device region 200. Isolation regions 22 such as Shallow Trench Isolation (STI) regions are formed in substrate 20. N-well region 23 may be formed in substrate 20, and in device region 200.

Gate stacks 102 and 202 are formed over substrate 20, and in device regions 100 and 200, respectively. Gate stack 102 includes gate dielectric 104, gate electrode 106 over gate dielectric 102, and hard mask 108 over gate electrode 106. Protection spacers 110 are formed on the sidewalls of gate dielectric 104 and gate electrode 106, and possibly on the sidewalls of hard mask 108. Gate stack 202 includes gate dielectric 204, gate electrode 206 over gate dielectric 202, and hard mask 208 over gate electrode 206. Protection spacers 210 are formed on the sidewalls of gate dielectric 204 and gate electrode 206, and possibly on the sidewalls of hard mask 208. In some exemplary formation process for forming gate stacks 102 and 202, a gate dielectric layer is formed on substrate 20, followed by the formation of a gate electrode layer and a hard mask layer. The gate dielectric layer, the gate electrode layer, and the hard mask layer are then patterned to form gate stacks 102 and 202. In some embodiment, gate dielectrics 104 and 204 comprise an oxide, a nitride, high-k dielectric materials, and/or the like. Gate electrodes 106 and 206 may comprise polysilicon, a metal, a metal silicide, or the like. Protection spacers 110 and 210 may be formed using deposition, thermal oxidation, or the like.

Figure 2:
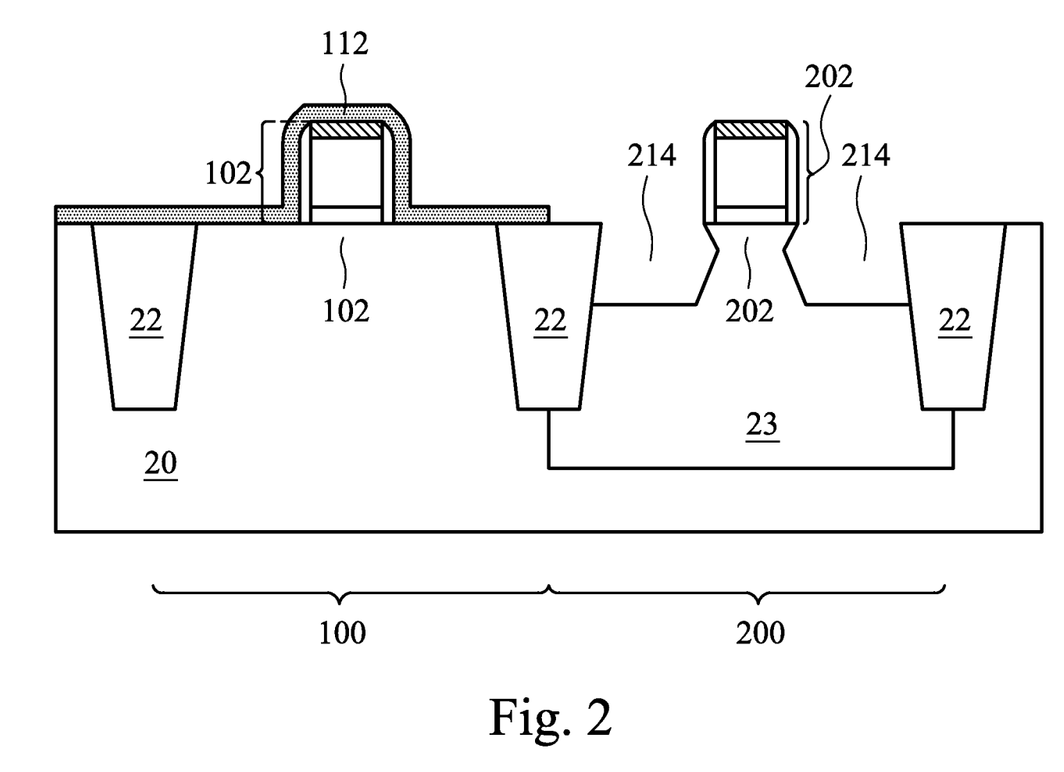

FIG. 2 illustrates the formation of mask layer 112 and recesses 214. Mask layer 112 may be formed in both device regions 100 and 200, and then removed from device region 200. In some embodiments, mask layer 112 includes an oxide layer and a silicon nitride layer over the silicon oxide layer, although other materials may be used. Next, recesses 214 are formed in substrate 20 and on opposite sides of gate stack 202, for example, by etching into substrate 20. In the formation of recesses 214, gate stack 202 and mask layer 112 are used as etching masks.

Figure 3:
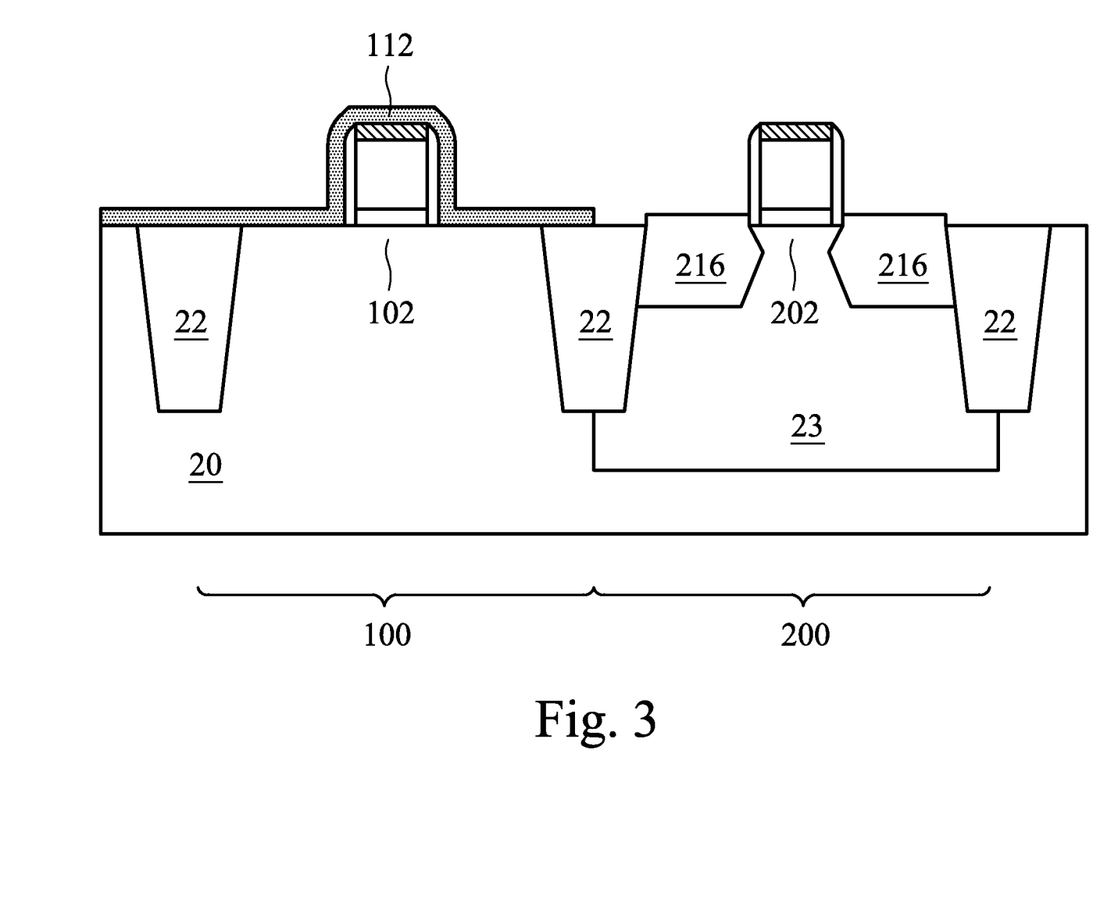

FIG. 3 illustrates the formation of silicon germanium regions 216 (often referred to as SiGe stressors), for example, using Selective Epitaxy Growth (SEG). In some exemplary embodiments, SiGe stressors 216 are formed using Plasma Enhanced Chemical Vapor Deposition (PECVD). The precursors include Si-containing gases and Ge-containing gases, such as $SiH_4$ and $GeH_4$, respectively. During the epitaxy, the partial pressures of the Si-containing gases and Ge-containing gases are adjusted to modify the atomic ratio of germanium to silicon. The resulting SiGe stressors 216 may have a germanium atomic percentage between about 10 atomic percent and about 50 atomic percent. In some embodiments, p-type impurities, such as boron and/or indium, are in-situ doped into SiGe stressors 216 to a high concentration, which may be between about $10^{19}/cm^3$ and about $10^{21}/cm^3$, for example. In alternative embodiments, no p-type dopant is doped during the epitaxial growth of SiGe stressors 216. The top surface of SiGe stressors 216 may be level with, higher than, or lower than, the top surface of substrate 20. SiGe stressors 216 may include top portions and bottom portions that have different germanium percentages. For example, the germanium percentage of the top portions of SiGe stressors 216 may be higher or lower than the germanium percentage of the lower portions of SiGe stressors 216.

Figure 4:
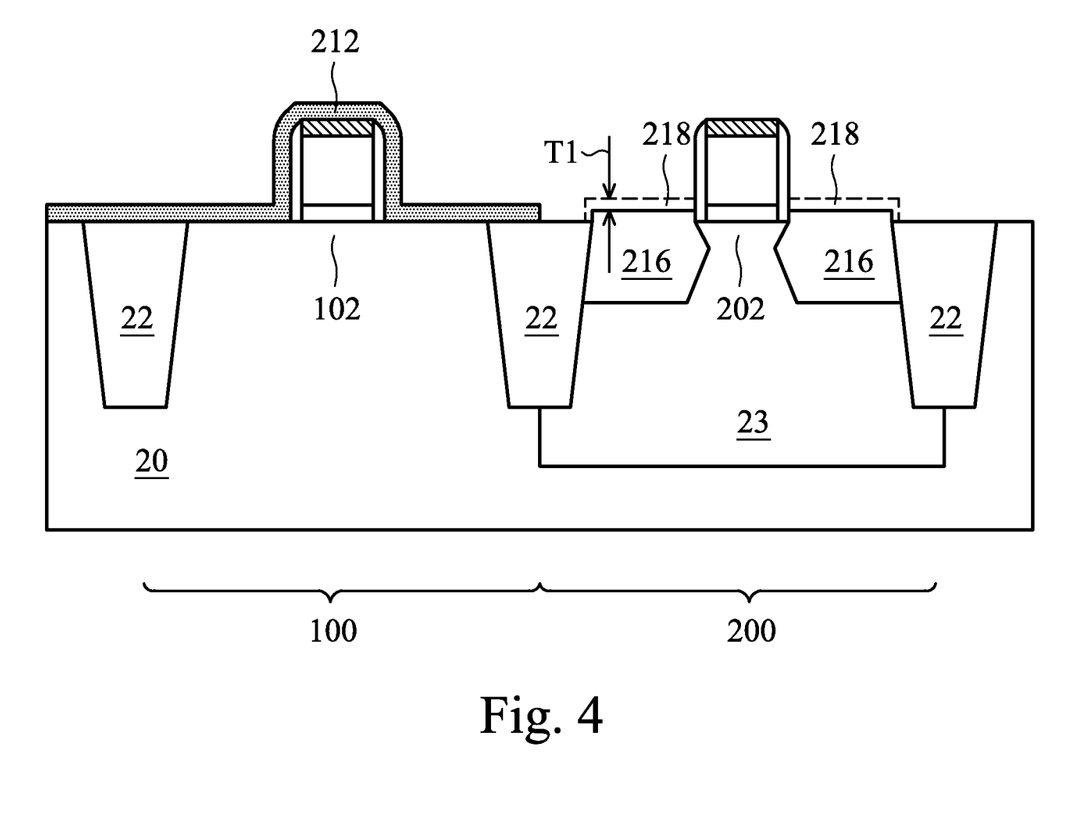

Referring to FIG. 4, in some embodiments, after the formation of SiGe stressors 216, silicon layer 218 is formed over SiGe stressors 216 by epitaxy. Silicon layer 218 may include portions that are in physical contact with SiGe stressors 216. The formation of silicon layer 218 may be performed in-situ with the formation of SiGe stressors 216, that is, in the same chamber and having no vacuum break between the formation of SiGe stressors 216 and the formation of silicon layer 218. In some embodiments, the transition from forming SiGe stressors 216 to the formation of silicon layer 218 is through turning off the flow of $GeH_4$ into the respective process chamber, while $SiH_4$ is still introduced into the process chamber. During the epitaxy of silicon layer 218, a p-type impurity, such as boron, indium, or the like, may be in-situ doped with the proceeding of the epitaxy. The doping concentration of the p-type impurity may be between about $10^{19}/cm^3$ and about $10^{21}/cm^3$, for example. Thickness T1 of silicon layer 218 is determined based on the desirable thickness T2 of silicon layers 132 and 232 (FIG. 8), so that the total thickness (T1+T2) of silicon layers 218 and 232 is controlled.

Figure 5:
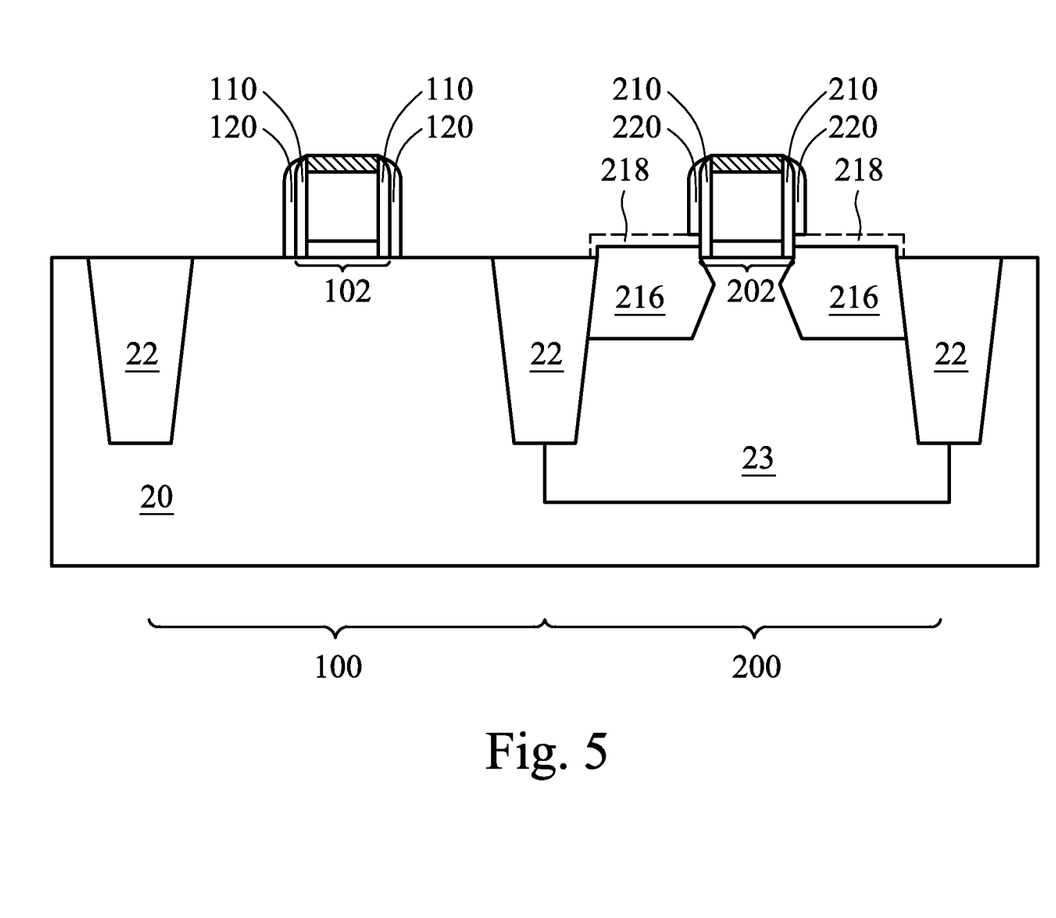

FIG. 5 illustrates the removal of mask layer 112 and the formation of main spacers 120 and 220, which are formed by blanket depositing gate spacer layer(s), and then removing the horizontal portions of the gate spacer layer(s). The deposition may be performed using PECVD, Low-Pressure Chemical Vapor Deposition (LPCVD), Sub-Atmospheric Chemical Vapor Deposition (SACVD), or the like. The patterning may be performed using dry etching. In some embodiments, main spacers 120 and 220 include liner oxide portions and overlying nitride portions. In alternative embodiments, main spacers 120 and 220 include one or more layers, each comprising oxide, silicon nitride, silicon oxynitride (SiON) and/or other dielectric materials.

Figure 6:
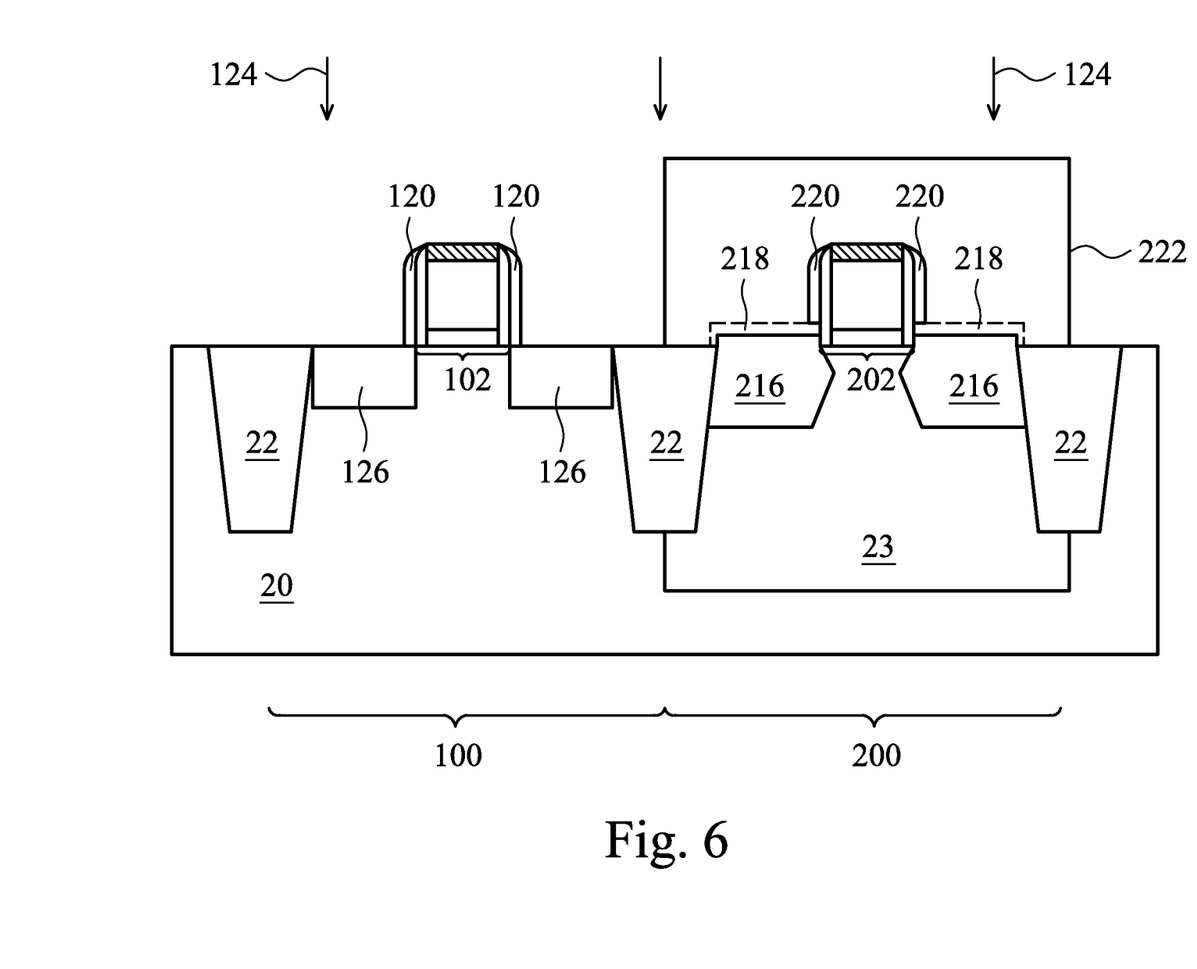

Referring to FIG. 6, mask layer 222 is formed to cover the region 200, as shown in FIG. 6. Between the epitaxy of silicon layer 218 and the formation of mask layer 222, a vacuum break may occur, and mask layer 222 is formed in a production tool different from the process chamber for growing silicon layer 218. In some embodiments, mask layer 222 is a photo resist. In alternative embodiments, mask layer 222 includes layers such as a photo resist, an anti-reflect coating (ARC), a hard mask, or combinations thereof. A Pre-Amorphization Implantation (PAI), as symbolized by arrows 124, is then performed. In some embodiments, silicon or germanium is implanted. In other embodiments, inert gases, such as neon, argon, xenon, and radon, are used. The pre-amorphization implantation results in the lattice structure of the substrate 20 to be destroyed, and results in the formation of PAI regions 126 in substrate 20. When PAI regions 126 are formed, the structure in device region 200 is protected by mask layer 222, and hence no PAI region is formed in device region 200. After the formation of PAI regions 126, mask layer 222 is removed.

Figure 7:
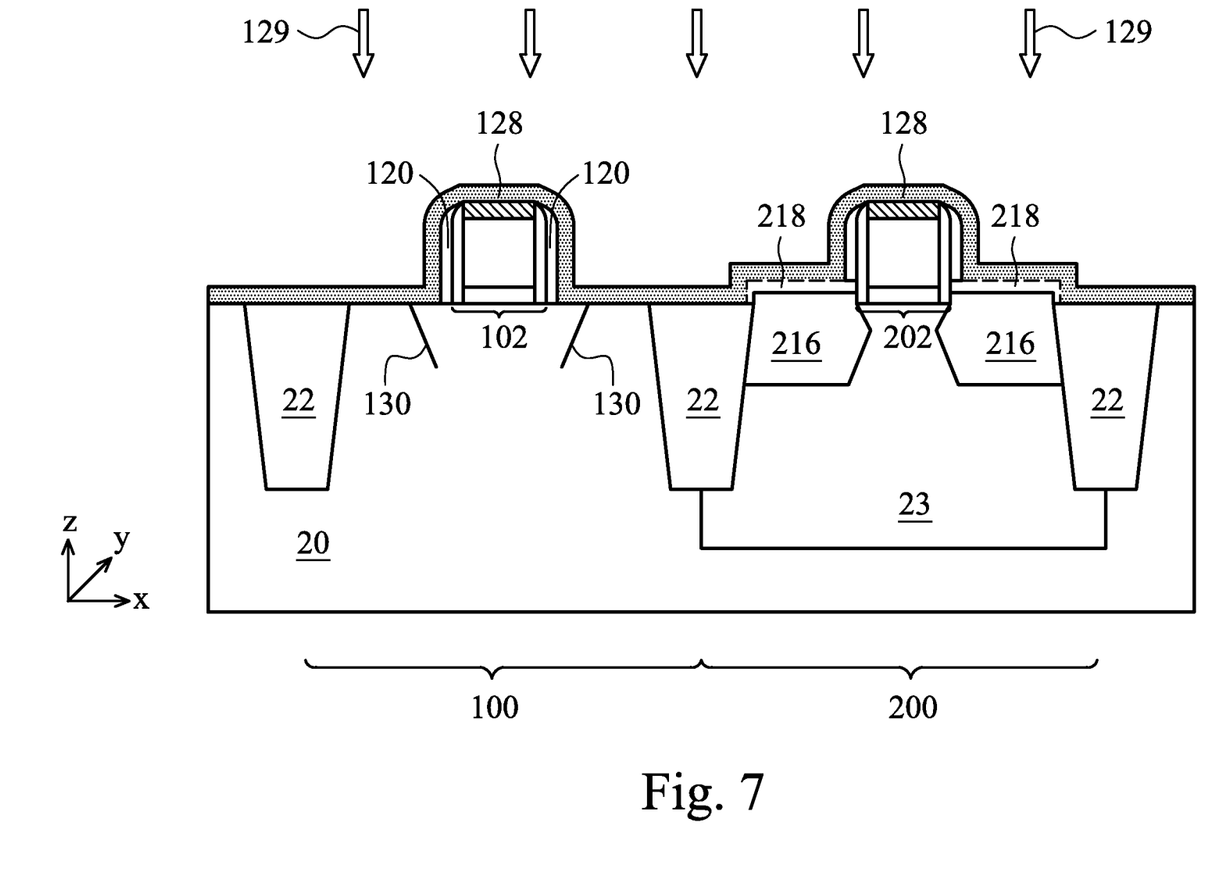

FIG. 7 illustrates the formation of strained capping layer 128, which has an inherent tensile strain. Appropriate materials and formation processes for forming strained capping layer 128 are selected, so that the strain in strained capping layer 128 is high. Strained capping layer 128 may comprise SiN, oxynitride, oxide, SiGe, SiC, SiON, or combinations thereof. In some embodiments, a buffer layer (not shown) may be formed over substrate 20 and under strained capping layer 128. The buffer layer may be an oxide film acting as an etch stop layer when removing strained capping layer 128 (such as SiN). For example, the buffer oxide prevents substrate 20 from the attack by phosphorous acid ($H_3PO_4$), which is used for removing nitride-containing strained capping layer 128. Strained capping layer 128 may be a single layer or a composite layer including a plurality of layers.

An anneal is then performed, as symbolized by arrows 129. The anneal may be performed using Rapid Thermal Anneal (RTA), thermal spike RTA anneal, or other anneal methods. In some embodiments, the anneal is performed using spike RTA. As a result of the anneal, PAI regions 126 are recrystallized (and hence are not illustrated) with a memorized stress obtained from strained capping layer 128. Accordingly, semiconductor substrate 20 applies a tensile stress to the channel region of the resulting NMOS device, so that the drive current of the resulting NMOS device is improved. As the result of the annealing, dislocation planes 130 are formed. Although illustrated as lines in the cross-sectional view shown in FIG. 7, dislocation planes 130 are planes that extend in the longitudinal direction of gate electrode 106, which is also the Y direction in FIG. 7.

Figure 8:
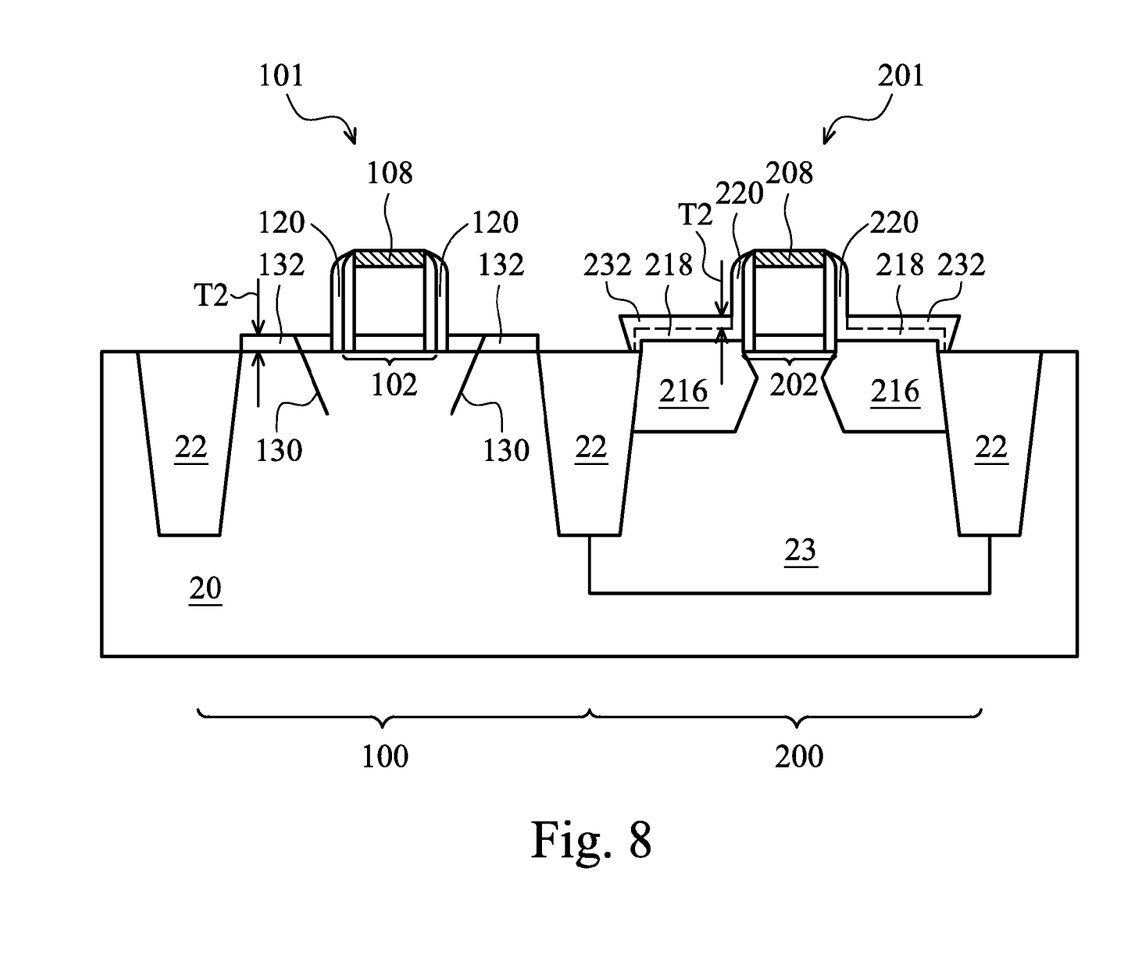

Next, referring to FIG. 8, an etch step is performed, and strained capping layer 128 is removed. An additional epitaxy step is performed to form silicon layers 132 and 232, which may be free from germanium, in device regions 100 and 200, respectively. Silicon layers 132 and 232 are formed simultaneously. In some embodiments, during the epitaxy, no p-type and n-type impurities are added. Accordingly, silicon layers 132 and 232 are un-doped layers in accordance with some exemplary embodiments. In device region 100, silicon layers 132 are over and in contact with substrate 20. In device region 200, silicon layers 232 are over and in contact with silicon layers 218, or over and in contact with SiGe stressors 216 when silicon layers 218 are not formed. As a result of the epitaxy, dislocation planes 130 grow into the overlying silicon layers 132.

Figure 9:
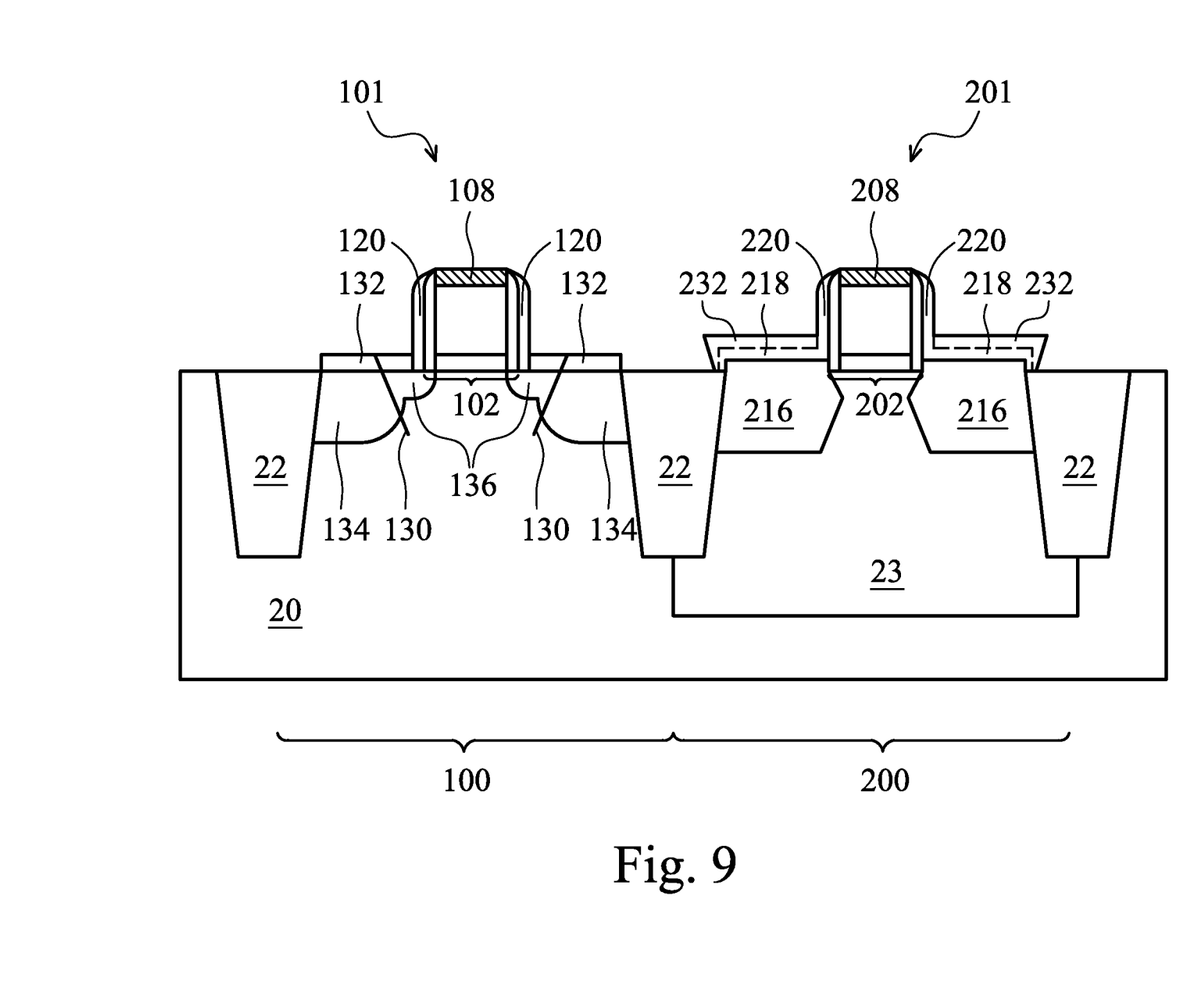

Referring to FIG. 9, a deep implantation is performed to form deep source and drain regions 134 (hereinafter referred to as source/drain regions). For forming source/drain regions 134, a photo resist (not shown) is formed to cover PMOS region 200. An implantation is then preformed to introduce n-type impurities to form deep source/drain regions 134. The photo resist is then removed. In some embodiments, an additional photo resist (not shown) is formed to cover the structure in NMOS region 100, and an implantation is preformed to introduce p-type impurities to form deep source/drain regions 234. The additional photo resist is then removed. In alternative embodiments, no implantation is performed on PMOS region 200, and the source/drain regions of the PMOS device in device region 200 are formed through the in-situ doping of SiGe stressors 216 (FIG. 4).

It is noted that FIG. 9 also illustrates lightly doped source/drain regions 136. The formation process of lightly doped source/drain regions 136 are not discussed in detail. In some embodiments, lightly doped source/drain regions 136 may be formed before or after the formation of protection spacers 110 (FIG. 1) and before the formation of main spacers 120 (FIG. 5). Although not shown, doped source/drain regions may also be formed for the PMOS device in device region 200.

Figure 10:
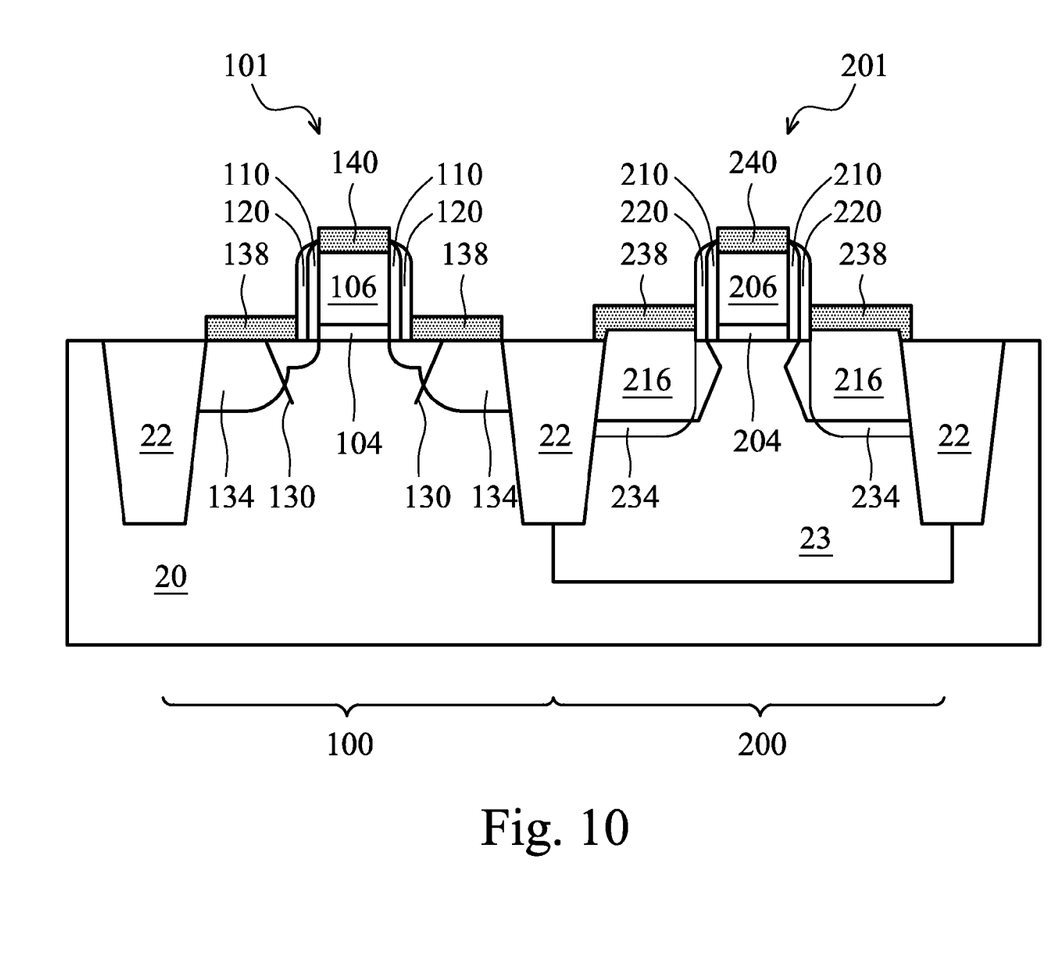

FIG. 10 illustrates the removal of hard mask 108 and 208 (FIG. 9), and the formation of silicide regions 138, 140, 238, and 240. In some embodiments, silicide regions 138, 140, 238, and 240 are formed by blanket depositing a metal layer (not shown), which may comprise nickel, platinum, palladium, titanium, cobalt, or combinations thereof. The respective wafer is then heated, which causes silicon and/or germanium to react with the metal where contacted. After the reaction, a layer of metal silicide is formed between silicon and metal. The un-reacted metal is selectively removed through the use of an etchant that attacks metal but does not attack silicide and germano-silicide. In some embodiments, silicon layers 218, 132, and 232 are fully consumed by the silicide process. This may be achieved by controlling the thickness T1 of silicon layer 218 (FIG. 2) and thickness T2 of silicon layer 232. NMOS device 101 and PMOS device 201 are thus formed.

In the embodiments, by forming silicon layers in device regions 100 and 200 simultaneously, there is no need to form a mask to cover the PMOS device when the raised source/drain regions are epitaxially grown in the NMOS device region. This results in the reduction in the process steps and the lowering of manufacturing cost. Process variations are also reduced.

It is appreciated that in the illustrated examples, device regions 100 and 200 are an NMOS device region and a PMOS device region, respectively, the conductivity types of device regions 100 and 200, and the respective MOS devices 101 and 201 formed therein, may be inverted. The conductivity types of MOS devices 101 and 201 may thus be inverted accordingly. The respective stressors 216 may introduce a tensile stress to the respective channel, and may be silicon carbon stressors, for example.

In accordance with embodiments, a method includes forming a first gate stack of a first device over a semiconductor substrate, and forming a second gate stack of a second MOS device over the semiconductor substrate. A first epitaxy is performed to form a source/drain stressor for the second MOS device, wherein the source/drain stressor is adjacent to the second gate stack. A second epitaxy is performed to form a first silicon layer and a second silicon layer simultaneously, wherein the first silicon layer is over a first portion of the semiconductor substrate, and is adjacent the first gate stack. The second silicon layer overlaps the source/drain stressor.

In accordance with other embodiments, a method includes forming a first gate stack of an NMOS device over a semiconductor substrate, and forming a second gate stack of a PMOS device over the semiconductor substrate. A silicon germanium stressor is formed adjacent the second gate stack. A dislocation plane is formed in a portion of the semiconductor substrate and adjacent the first gate stack. An epitaxy is performed to form a first silicon layer and a second silicon layer simultaneously. The first silicon layer overlaps the portion of the semiconductor substrate, with the dislocation plane growing into the first silicon layer. The second silicon layer overlaps the silicon germanium stressor.

In accordance with yet other embodiments, a method includes forming a first gate stack of an NMOS device over a semiconductor substrate, and forming a second gate stack of a PMOS device over the semiconductor substrate. A mask is formed to cover the first gate stack and a first portion of the semiconductor substrate adjacent the first gate stack. The method further includes, when the first gate is covered by the mask, performing the steps of forming a recess adjacent the second gate stack and in a second portion of the semiconductor substrate, performing a first epitaxy to grow a silicon germanium stressor in the recess, and performing a second epitaxy to grow a doped silicon layer substantially free from germanium over the silicon germanium stressor. A p-type impurity is in-situ doped when the second epitaxy is performed. The method further includes removing the mask, and performing a third epitaxy to form an un-doped silicon layer, which includes a first portion over and contacting the first portion of the semiconductor substrate, and a second portion over and contacting the doped silicon layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a first gate stack of a first Metal-Oxide-Semiconductor (MOS) device over a semiconductor substrate;
   forming a second gate stack of a second MOS device over the semiconductor substrate, wherein the first and the second MOS devices are of opposite conductivity types;
   performing a first epitaxy to form a source/drain stressor for the a second MOS device, wherein the source/drain stressor is adjacent to the second gate stack; and
   performing a second epitaxy to form a first silicon layer and a second silicon layer simultaneously, wherein the first silicon layer is over a first portion of the semiconductor substrate, and is adjacent the first gate stack, and wherein the second silicon layer overlaps the source/drain stressor.

2. The method of claim 1 further comprising:
   forming a mask covering the first gate stack and the first portion of the semiconductor substrate; and
   before the second epitaxy, performing a third epitaxy to grow a third silicon layer using the mask as a mask, wherein the third silicon layer is overlying the source/drain stressor and underlying the second silicon layer.

3. The method of claim 2, wherein a vacuum break occurs between the second epitaxy and the third epitaxy.

4. The method of claim 2 further comprising, when the third epitaxy is performed, in-situ doping an impurity into the third silicon layer, wherein the impurity has a same conductivity type as the source/drain stressor.

5. The method of claim 2, wherein the first epitaxy and the third epitaxy are in-situ performed, with no vacuum occurring therebetween.

6. The method of claim 5 further comprising, before the third epitaxy:
   performing a Pre-Amorphization Implantation (PAI) on the first portion of the semiconductor substrate to form a PAI region in the first portion of the semiconductor substrate;
   forming a strained capping layer over the first gate stack and the first portion of the semiconductor substrate;
   performing an anneal to form a dislocation plane in the first portion of the semiconductor substrate; and
   after the anneal, removing the strained capping layer.

7. The method of claim 1, wherein the first silicon layer and the second silicon layer are not in-situ doped during the second epitaxy.

8. The method of claim 1 further comprising:
   implanting the first silicon layer and the first portion of the semiconductor substrate to form a source/drain region of the first MOS device;
   siliciding the first silicon layer to form a source/drain silicide for the first MOS device; and
   siliciding the second silicon layer to form a source/drain silicide for the second MOS device.

9. A method comprising:
   forming a first gate stack of an N-type Metal-Oxide-Semiconductor (NMOS) device over a semiconductor substrate;
   forming a second gate stack of a P-type Metal-Oxide-Semiconductor (PMOS) device over the semiconductor substrate;
   forming a silicon germanium stressor adjacent the second gate stack;
   forming a dislocation plane in a portion of the semiconductor substrate and adjacent the first gate stack; and
   performing a first epitaxy to form a first silicon layer and a second silicon layer simultaneously, wherein the first silicon layer overlaps the portion of the semiconductor substrate, with the dislocation plane growing into the first silicon layer, and wherein the second silicon layer overlaps the silicon germanium stressor.

10. The method of claim 9, wherein during the first epitaxy, the first silicon layer and the second silicon layer are not in-situ doped with p-type and n-type impurities.

11. The method of claim 9 further comprising, before the first epitaxy, performing a second epitaxy to grow a third silicon layer over and contacting the silicon germanium stressor, and wherein the second silicon layer is over and contacting the third silicon layer.

12. The method of claim 11 further comprising, when the second epitaxy is performed, in-situ doping a p-type impurity.

13. The method of claim 12, wherein the p-type impurity is in-situ doped to an impurity concentration between about $10^{19}/cm^3$ and about $10^{21}/cm^3$.

14. The method of claim 9 wherein the step of forming the dislocation plane comprises:
   performing a Pre-Amorphization Implantation (PAI) on the portion of the semiconductor substrate to form a PAI region in the portion of the semiconductor substrate;
   forming a strained capping layer over the first gate stack and the portion of the semiconductor substrate;
   performing an anneal to form the dislocation plane in the portion of the semiconductor substrate; and
   after the anneal, removing the strained capping layer.

15. A method comprising:
   forming a first gate stack of an N-type Metal-Oxide-Semiconductor (NMOS) device over a semiconductor substrate;
   forming a second gate stack of a P-type Metal-Oxide-Semiconductor (PMOS) device over the semiconductor substrate;
   forming a first mask to cover the first gate stack and a first portion of the semiconductor substrate adjacent the first gate stack;
   when the first gate stack is covered by the first mask, performing steps of:
      forming a recess adjacent the second gate stack and in a second portion of the semiconductor substrate;
      performing a first epitaxy to grow a silicon germanium stressor in the recess; and
      performing a second epitaxy to grow a doped silicon layer substantially free from germanium over the silicon germanium stressor, wherein a p-type impurity is in-situ doped when the second epitaxy is performed;
   removing the first mask; and
   performing a third epitaxy to form an un-doped silicon layer comprising a first portion over and contacting the first portion of the semiconductor substrate, and a second portion over and contacting the doped silicon layer.

16. The method of claim 15 further comprising:
   forming a second mask masking the second gate stack, and performing a Pre-Amorphization Implantation (PAI) on the first portion of the semiconductor substrate to form a PAI region in the first portion of the semiconductor substrate;
   forming a strained capping layer over the first gate stack and the second gate stack;
   performing an anneal to form a dislocation plane in the first portion of the semiconductor substrate; and
   after the anneal, removing the strained capping layer.

17. The method of claim 15 further comprising:
   siliciding the first portion of the un-doped silicon layer to form a source/drain silicide for the NMOS device; and
   siliciding the second portion of the un-doped silicon layer and the doped silicon layer to form a source/drain silicide for the PMOS device.

18. The method of claim 17, wherein in the step of siliciding, substantially an entirety of the un-doped silicon layer and the doped silicon layer is consumed by the siliciding.

19. The method of claim 15, wherein the first epitaxy and the second epitaxy are in-situ performed, with no vacuum therebetween.

20. The method of claim 15, wherein a vacuum break occurs between the second epitaxy and the third epitaxy.

* * * * *